US006979627B2

(12) United States Patent
Yeap et al.

(10) Patent No.: US 6,979,627 B2
(45) Date of Patent: Dec. 27, 2005

(54) ISOLATION TRENCH

(75) Inventors: Choh-Fei Yeap, Austin, TX (US); Yongjoo Jeon, Austin, TX (US); Michael D. Turner, San Antonio, TX (US); Toni D. Van Gompel, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/836,150

(22) Filed: Apr. 30, 2004

(65) Prior Publication Data

US 2005/0242403 A1  Nov. 3, 2005

(51) Int. Cl.[7] ............................................. H01L 21/76
(52) U.S. Cl. ...................................... 438/424; 438/435
(58) Field of Search .............................. 438/359, 404, 438/424, 435, 436, 437

(56) References Cited

U.S. PATENT DOCUMENTS

| | | | | |
|---|---|---|---|---|
| 4,702,796 A | * | 10/1987 | Nakajima et al. | 438/252 |
| 5,578,518 A | * | 11/1996 | Koike et al. | 438/424 |
| 5,872,058 A | * | 2/1999 | Van Cleemput et al. | 438/692 |
| 6,121,133 A | * | 9/2000 | Iyer et al. | 438/636 |
| 6,150,238 A | * | 11/2000 | Wu et al. | 438/435 |
| 6,277,709 B1 | * | 8/2001 | Wang et al. | 438/430 |
| 6,479,361 B1 | * | 11/2002 | Park | 438/353 |
| 6,524,929 B1 | | 2/2003 | Xiang | |
| 6,531,377 B2 | * | 3/2003 | Knorr et al. | 438/435 |
| 6,541,382 B1 | | 4/2003 | Cheng | |
| 6,576,949 B1 | * | 6/2003 | Park | 257/314 |
| 6,602,792 B2 | | 8/2003 | Hsu | |
| 6,613,649 B2 | * | 9/2003 | Lim et al. | 438/435 |
| 6,693,018 B2 | * | 2/2004 | Kim et al. | 438/418 |
| 6,798,038 B2 | * | 9/2004 | Sato et al. | 257/510 |
| 6,828,210 B2 | * | 12/2004 | Kim et al. | 438/424 |
| 2003/0087506 A1 | * | 5/2003 | Kirchhoff | 438/424 |
| 2003/0203595 A1 | * | 10/2003 | Divakaruni et al. | 438/435 |
| 2004/0203217 A1 | * | 10/2004 | Lai et al. | 438/435 |

* cited by examiner

Primary Examiner—Matthew Smith
Assistant Examiner—Lex H. Malsawma
(74) Attorney, Agent, or Firm—David G. Dolezal; Michael J. Balconi-Lamica

(57) ABSTRACT

A process for forming an isolation trench in a wafer. The process includes depositing (e.g. by a directional deposition process) a first dielectric material in the trench and then depositing a second dielectric material (e.g. by a directional deposition process) over the first dielectric material in the trench. A third material is deposited in the trench on the second layer. The second material and the third material are selectively etchable with respect to each other. In one example, the first material has a lower dielectric constant than the second material.

24 Claims, 5 Drawing Sheets

ISOLATION TRENCH

BACKGROUND OF THE INVENTION

1. Field of the Invention

This invention relates in general to semiconductor structures and in particular to isolation trenches for a semiconductor structures.

2. Description of the Related Art

Isolation trenches are utilized for isolating active regions of an integrated cirucuit. For example, isolation trenches are utlized to isolate active regions of a semiconductor on insulator (SOI) wafer where the isolation trench exends to the underlying insulator. With such configurations, the trench is cut to the insulator and the silicon sidewalls of the active layer are oxidized to round the corners of the trench. Afterwards, the trench is filled with a dielectric material. One problem is that subsequent thermal processes which can oxidize silicon may cause a birds beak of oxide to extend under the bottom of the active layer from the trench base.

FIG. 1 shows a partial cross section of a prior art wafer. Wafer 101 has a SOI configuration with an active silicon layer 107 located over insulator 105, which is located on a semiconductor substrate 103. Located at the bottom of isolation trench 109 is a "passivating" layer 111 of silicon nitride. An oxide 113 is subsequently formed on layer 111 in trench 109. Layer 111 prevents the formation of a birds beak of oxide into layer 107 at the bottom of trench 109 during subsequent thermal processes.

One problem with the configuration of FIG. 1 is that during subsequent oxide etchings, trench fill material 113 may removed in the trench beyond a desire depth. Such a condition may cause a short between subsequently formed gates of active regions isolated by the trench due to e.g. poly silicon stringers. Also, variation in trench depth removal may cause variations in transitor operation due to a varying effective width of the transitor from the gate extending into the channel.

Layer 111 may be made thicker to reduce the depth of oxide 113 in trench 109. However, increasing the thickness of nitride layer 111 may not be manufacurably feasible due to e.g. "breadloafing" of the nitride over the trench during deposition of the material of layer 111. Another problem with increasing the thickness of nitride layer 111 is that because the nitride has a higher dielectric constant, parasitic capaciance between active regions of layer 107 may be increased due to the higher dielectric constant of the nitride.

What is needed is an improved configuration of an isolation trench.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

FIGS. 2–10 show partial cross sectional side views of various stages of a wafer during a process of forming an isolation trench according to the present invention.

Figure 1:
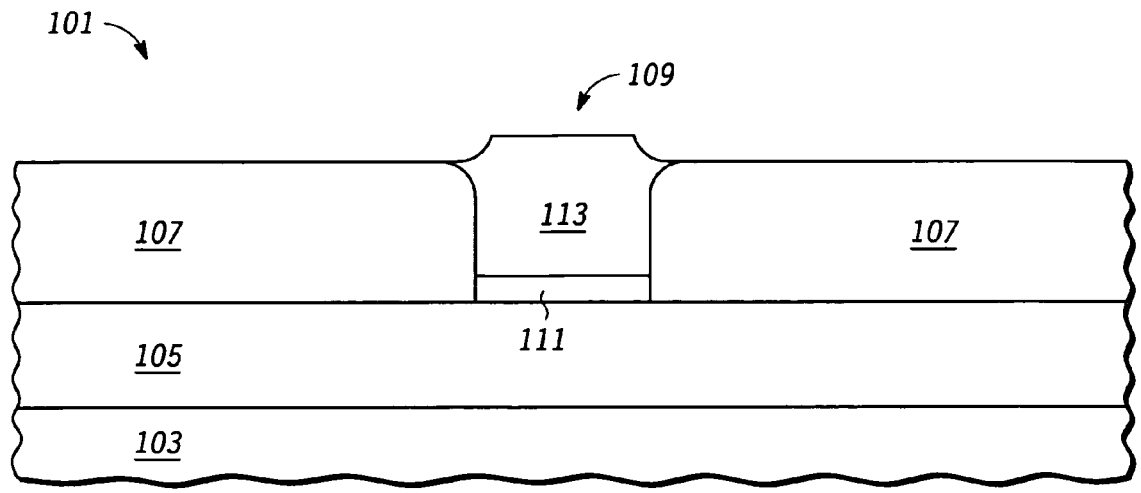
FIG. 1 is a partial cross sectional side view of a prior art wafer.
Figure 2:
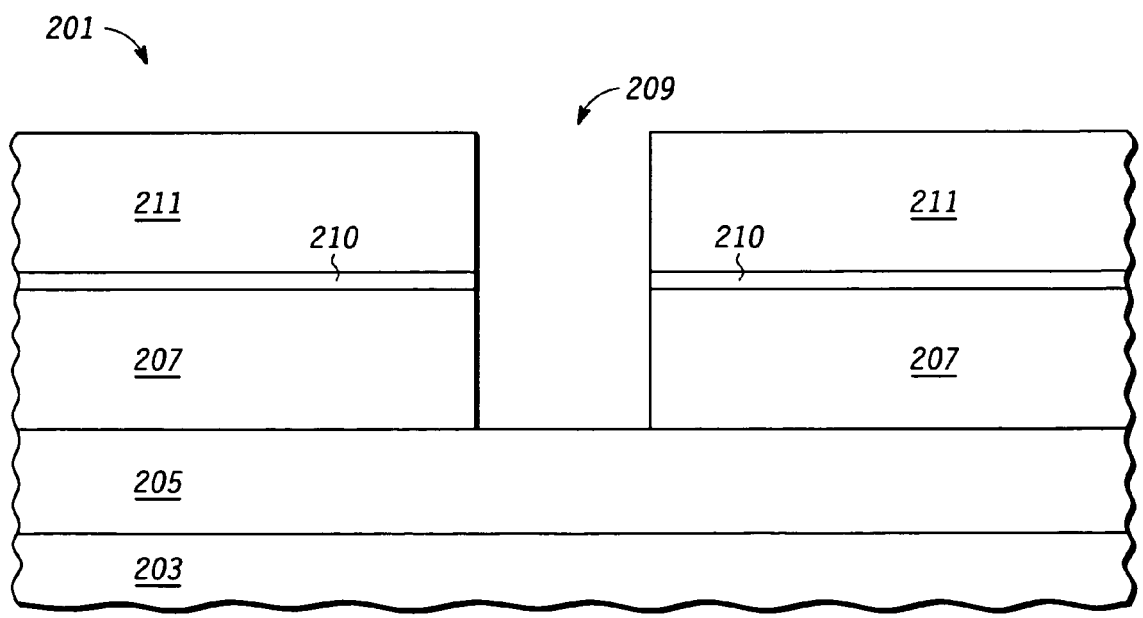
FIG. 2 is a partial cross sectional side view of a wafer during a stage of manufacture according to the present invention.

FIG. 2 is a partial cross sectional side view of wafer 201. In the embodiment shown, wafer 201 has an SOI configuration with an insulator 205 (e.g. 150 nm thick) located on substrate 203, and a layer 207 of active material located on insulator 205. In one embodiment, insulator 205 is made of e.g. silicon oxide and substrate 203 is made of silicon. In other embodiments, wafer 201 may have other configurations including non SOI configurations (e.g. a bulk silicon wafer) or other SOI configurations.

In some embodiments, layer 207 is 70 to 200 nm thick and is made of silicon. In other embodiments, layer 207 may have other thickness and may be made of other semiconductor materials (e.g. silicon germanium, gallium arsenide). Also in other embodiments, layer 207 may be made of multiple layers of different materials (e.g. a layer of silicon on a layer of silicon germanium).

In the embodiment shown, wafer 201 includes a thermal oxide protective layer 210 located on layer 207 and an antireflective coating (ARC) layer 211 located on layer 210. In one embodiment, layer 211 is made of a nitride (e.g. stoichiometric silicon nitride). Protective layer 210 (e.g. 5 to 20 nm thick) protects layer 207 during a subsequent etching of layer 211. Protective layer 210 may be made of other materials in other embodiments.

After the formation of layer 211, a trench 209 is formed in wafer 201 by e.g. patterning. In the embodiment shown, trench 209 extends to insulator 205. Other trenches (not shown) are formed at other locations of wafer 201.

Figure 3:
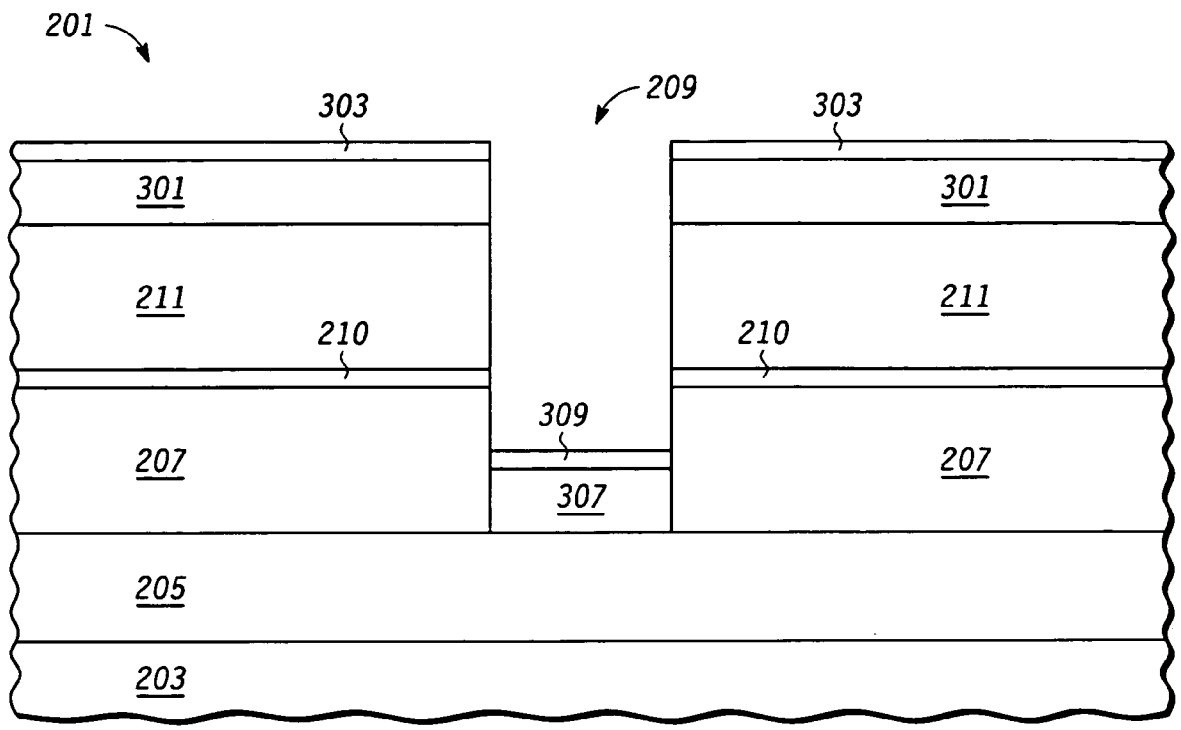
FIG. 3 is a partial cross sectional side view of a wafer during another stage of manufacture according to the present invention.

FIG. 3 is a partial cross sectional side view of wafer 201 after a layer 301 of oxide is deposited on wafer 201. During the deposition of layer 301, a portion of layer 301 is deposited on ARC layer 211 and another portion 307 of layer 301 is deposited in trench 209 on insulator 205. In one embodiment, layer 301 has a thickness of about one half the thickness of layer 207, but may be of other thicknesses in other embodiments. In some embodiments, layer 301 is an oxide (e.g. a carbon doped oxide, a fluorinated oxide, a porous oxide, TEOS, or other type of oxide). In other embodiments, layer 301 may be of other types of materials e.g. other types of low K dielectric materials.

In one embodiment, layer 301 is deposited by a directional deposition process. In a directional deposition process, the material is deposited from a controlled direction (e.g. normal to the surface of the wafer). With a directional deposition process, material is substantially deposited only on surfaces facing the controlled direction (e.g. the bottom of trench 209 and the top surface of layer 211). In the embodiment shown, with a directional deposition process, very little if any of the material of layer 301 is deposited on the sidewalls of trench 209. In one embodiment, layer 301 is deposited by an unbiased, high density, plasma enhanced chemical vapor deposition (CVD) process, which is a directional deposition process. In other embodiments, layer 301 may be deposited by other processes including other directional deposition processes such as sputtering (e.g. RF sputtering, collimated sputtering, magnetron sputtering, or evaporative sputtering), a plasma vapor deposition (PVD) process, a collimated PVD process, a thermal CVD process, or a high density plasma (HDP) process.

Using a directional deposition process may minimize the deposition of the material on the sidewall of a trench. Accordingly in some embodiments, the material in the trench may be protected from subsequent etchings and cleanings in that there is no significant path of like material from the top of the trench to the bottom of the trench.

In some embodiments, material deposited on the side walls may be removed prior the subsequent deposition of other materials on wafer 201.

Afterwards, a layer 303 is deposited on layer 301. A portion 309 of layer 303 is deposited in trench 209. In one embodiment, layer 303 is made of a nitride (e.g. silicon nitride) and has a thickness of 10 nm. In other embodiments, layer 303 may be made of other dielectric material that is selectablely etchable with respect to an oxide or selectively etchable with respect to a subsequently deposited trench fill material (e.g. layer 501). In some embodiments, layer 303 may be made of plasma enhanced CVD nitride, low pressure CVD nitride, bistertiarybutylaminosilane (BTBAS), silicon rich nitride, silicon carbide (SiC), or silicon carbon nitride (SiCN). In one embodiment, layer 303 is deposited by an unbiased, high density, plasma enhanced, chemical vapor deposition (CVD) process, but may be deposited in other embodiments by other deposition processes including other directional depositional processes. In other embodiments, layer 303 may have different thickness. In one embodiment, layer 303 is thick enough so as to protect portion 307 during subsequent oxide etchings and cleanings. In some embodiments, very little if any of the material of layer 303 is deposited on the sidewalls of trench 209. In some embodiments, material of layer 303 deposited on the side walls may be removed prior the subsequent deposition of materials on wafer 201.

Figure 4:
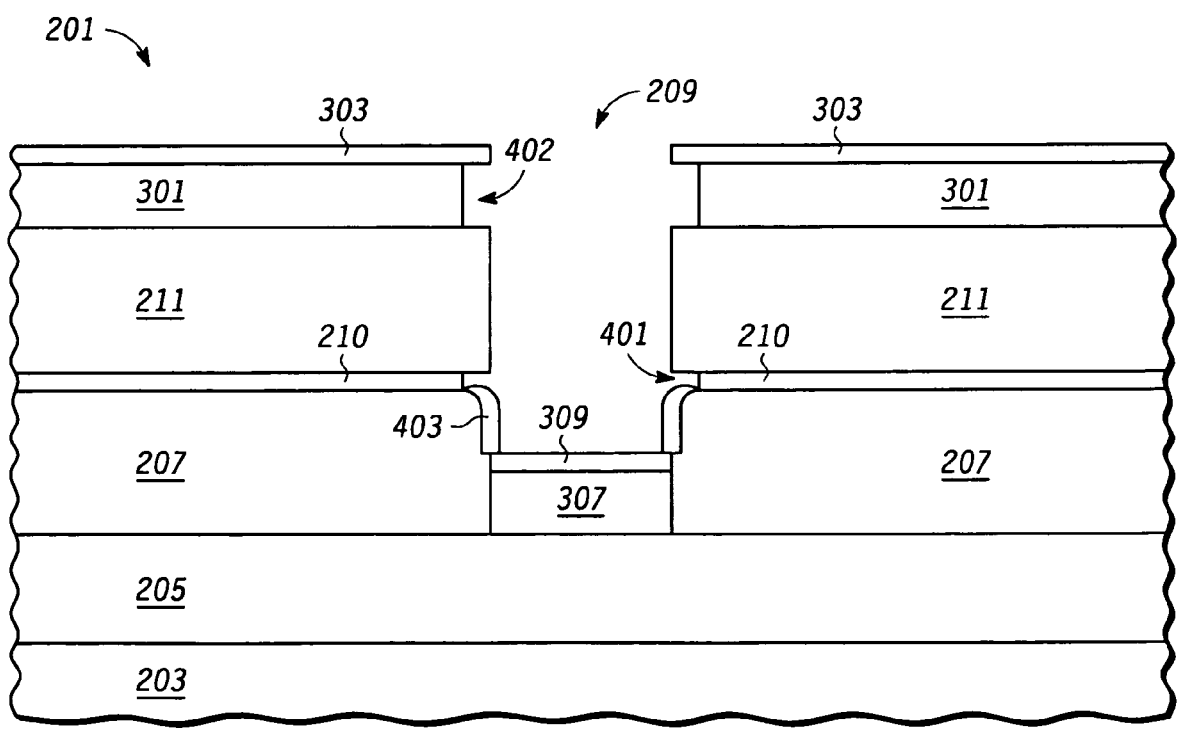
FIG. 4 is a partial cross sectional side view of a wafer during another stage of manufacture according to the present invention.

Referring to FIG. 4, the sidewalls of layer 210 (as well as the sidewalls of layer 301) are etched with an enchant (e.g. HF) that is selective to oxide to form recess 401 in layer 210 (and recess 402 in layer 301). Etching layer 210 exposes a top edge portion of layer 207 in trench 209 and rounds the upper corners of layer 207. Subsequently, a liner 403 is formed on the exposed sidewall of layer 207 in trench 209 by e.g. a high temperature oxidation process. The high temperature oxidation process acts to further round the exposed upper corners of layer 207 in trench 209. Having rounded corners may act to reduce leakage current and increase circuit reliability during operation. Portion 309 acts to inhibit the formation of a birds beak of oxide from being formed into layer 207 at the bottom of trench 209.

Figure 5:
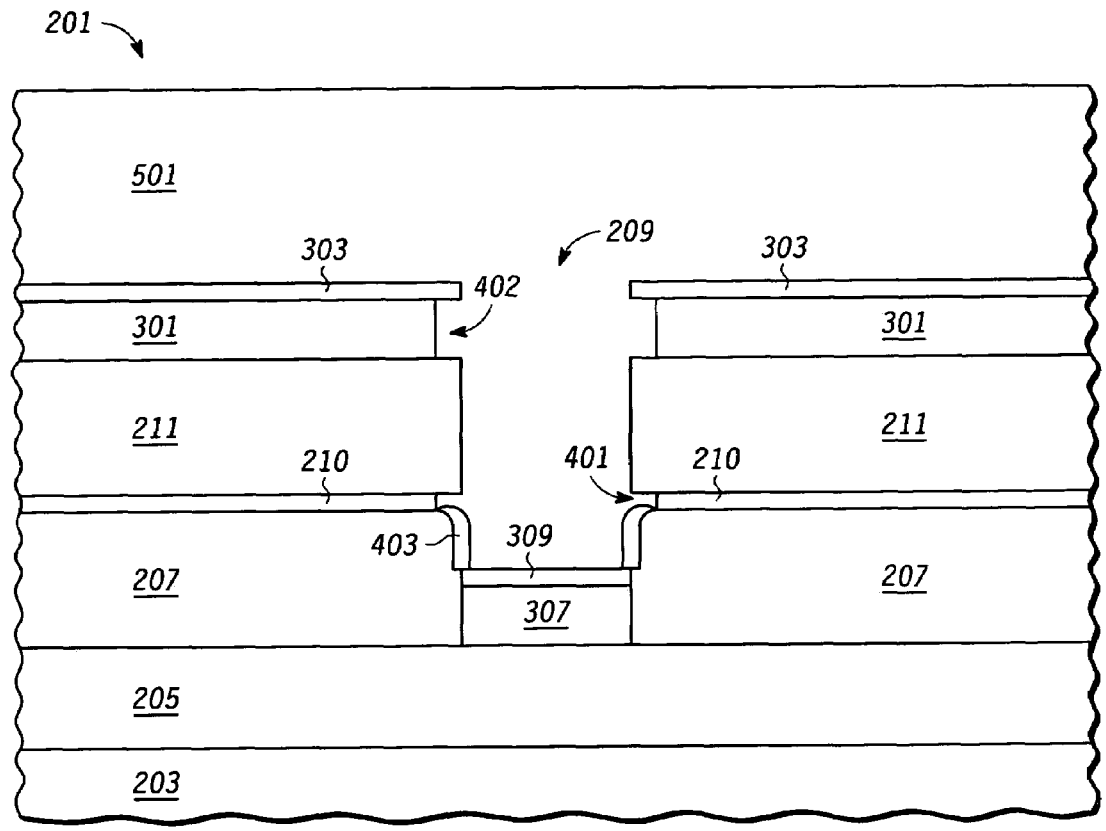
FIG. 5 is a partial cross sectional side view of a wafer during another stage of manufacture according to the present invention.

Referring to FIG. 5, after the rounding of the upper corner of layer 207, a layer 501 of non conformal trench fill material is deposited over wafer 201 including in trench 209. In one embodiment, the layer 501 is made of a dielectric such as an oxide (e.g. silicon oxide). In one embodiment, layer 501 is deposited by a biased, high density plasma, but may be deposited by other methods in other embodiments. The material of layer 501 is selectively etchable with respect to the material of layer 303.

Figure 6:
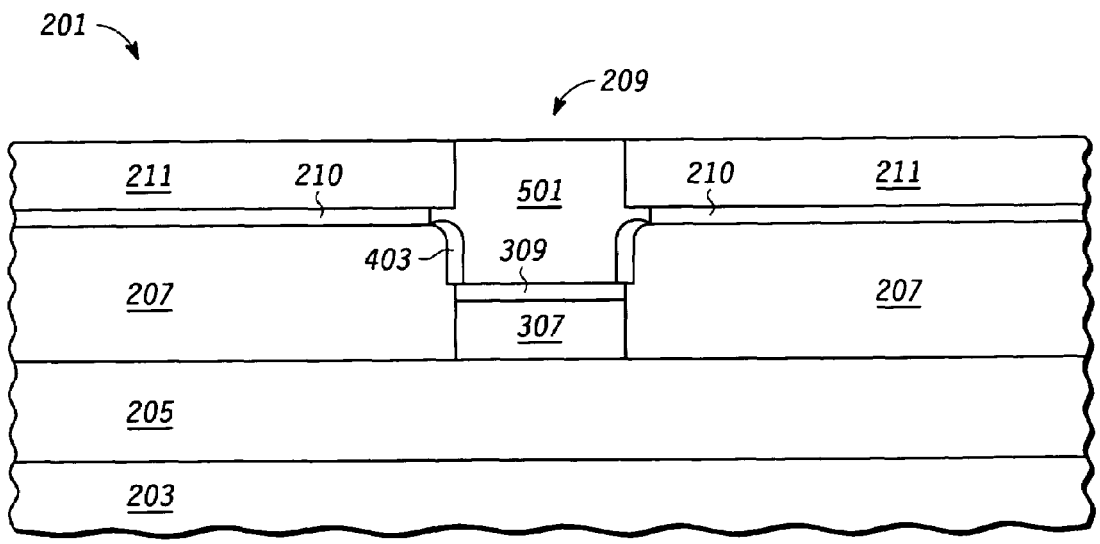
FIG. 6 is a partial cross sectional side view of a wafer during another stage of manufacture according to the present invention.

FIG. 6 shows wafer 201 after it has been subject to a chemical mechanical polish (CMP) process. In the embodiment shown, ARC layer 211 is used as a polishing stop layer in the CMP process. In the embodiment shown, wafer 201 is polished to a point where approximately half the thickness of ARC layer 211 is removed, but may be polished to another point in other embodiments. In other embodiments, wafer 201 may be subject to an etch back process (e.g. a chemical etch) where ARC layer 211 is used as an etch stop. As a result, only the portion of layer 501 in trench 209 remains.

Figure 7:
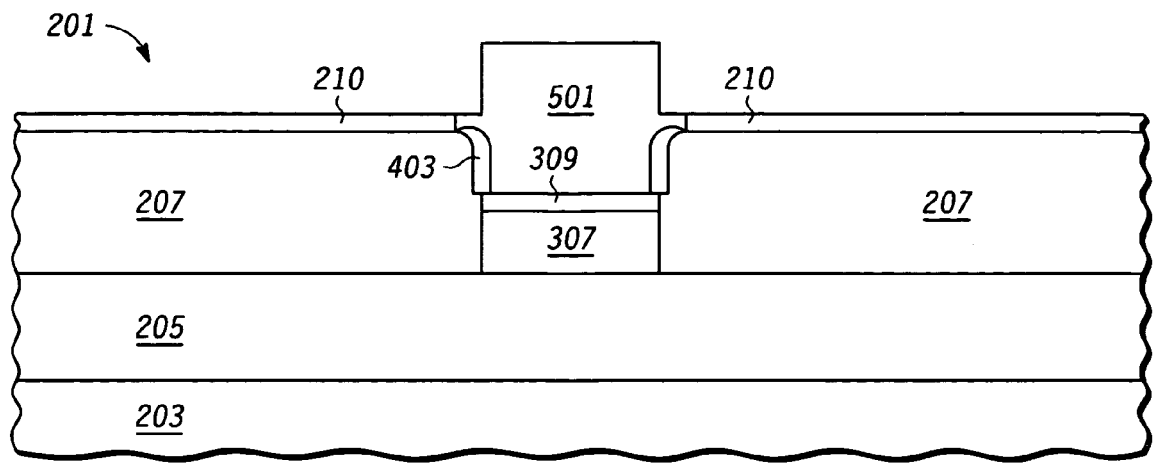
FIG. 7 is a partial cross sectional side view of a wafer during another stage of manufacture according to the present invention.

Referring to FIG. 7, the remaining portion of the layer 211 is removed by an enchant (e.g. a phosphoric acid $H_3PO_4$ etchant) that is selective with respect to the oxide of layer 501 and layer 210, with layers remaining after the etch. Portion 309 is protected from etching by the remaining portion of layer 501 and liner 403.

Figure 8:
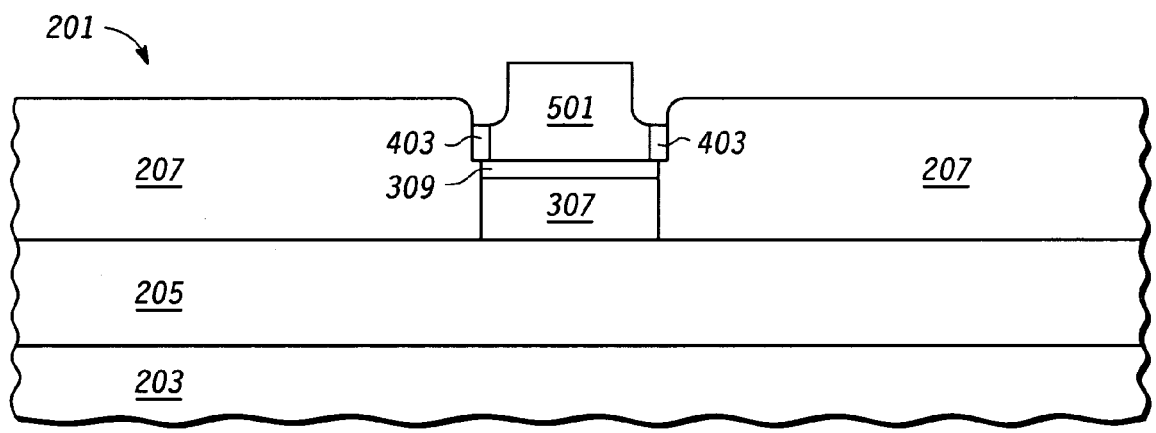
FIG. 8 is a partial cross sectional side view of a wafer during another stage of manufacture according to the present invention.

Referring to FIG. 8, in subsequent processes such e.g. cleaning and etching, portions of layer 501, portions of liner 403, and layer 210 are removed. With some embodiments, all of layer 501 and liner 403 maybe be removed in subsequent processes. Because portion 309 is selectively etchable with respect to the oxide of layer 501, portion 309 is not etched in subsequent process. Accordingly, the maximum depth of the trench material that is removed due to subsequent processes may be limited, thereby allowing a greater freedom in subsequent processes in some embodiments. Thus in some embodiments, the ability to reduce the maximum depth of removal of trench fill material may reduce the possibility of electrical shorting due e.g. poly stringers.

Furthermore, because, the majority of the trench is formed with a low K dielectric (e.g. oxide), the parasitic capacitance from the trench may be reduced due the to reduced amount of nitride.

Figure 9:
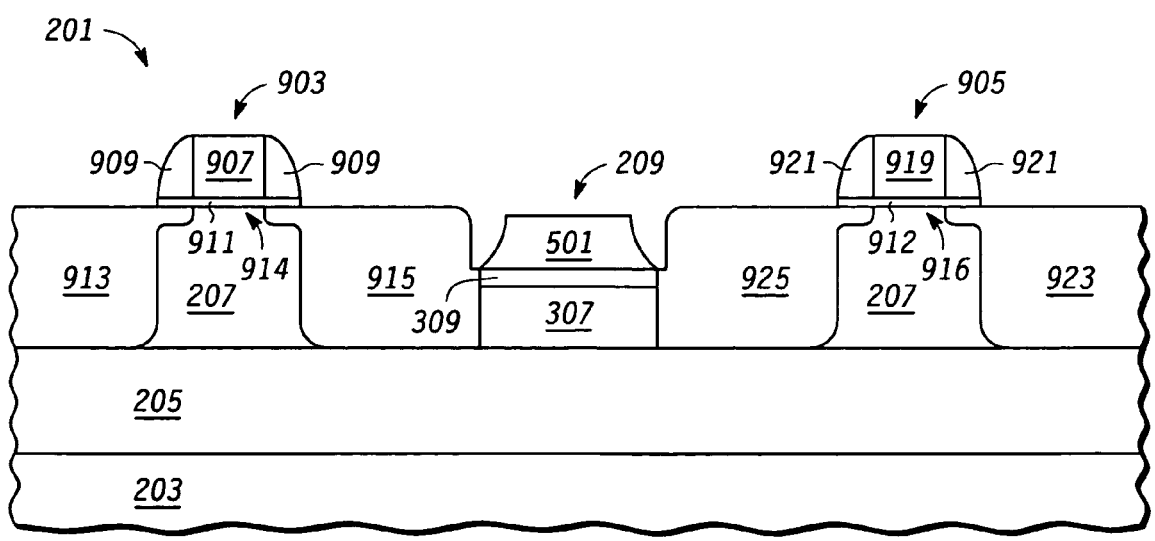
FIG. 9 is a partial cross sectional side view of a wafer during another stage of manufacture according to the present invention.

FIG. 9 is a view of wafer 201 after the formation of transistors 903 and 905. Transistor 903 includes a gate 907 (e.g. of poly silicon or metal) and spacer 909 located over a gate oxide 911. Transistor 905 includes gate 919 and spacer 921 over gate oxide 912. Source drain/regions 913, 915, 925, and 923 are formed in layer 207 by the selective doping of those regions. Transistors 903 and 905 each include a channel region, 914 and 916, respectively, located in layer 207 below the gate of the respective transistor. Source/drain region 925 is electrically isolated from source drain regions 915 by the dielectric material of portions 309 and 307 in trench. In the embodiment shown, portions of the remaining portions of layer 501 and liner 403 (as from the stage of FIG. 8) are removed during processes performed on wafer 201 prior to the stage shown in FIG. 9. In other embodiments, trench 209 may be refilled by the formation of other materials (e.g. dielectric materials of an ILD).

Figure 10:
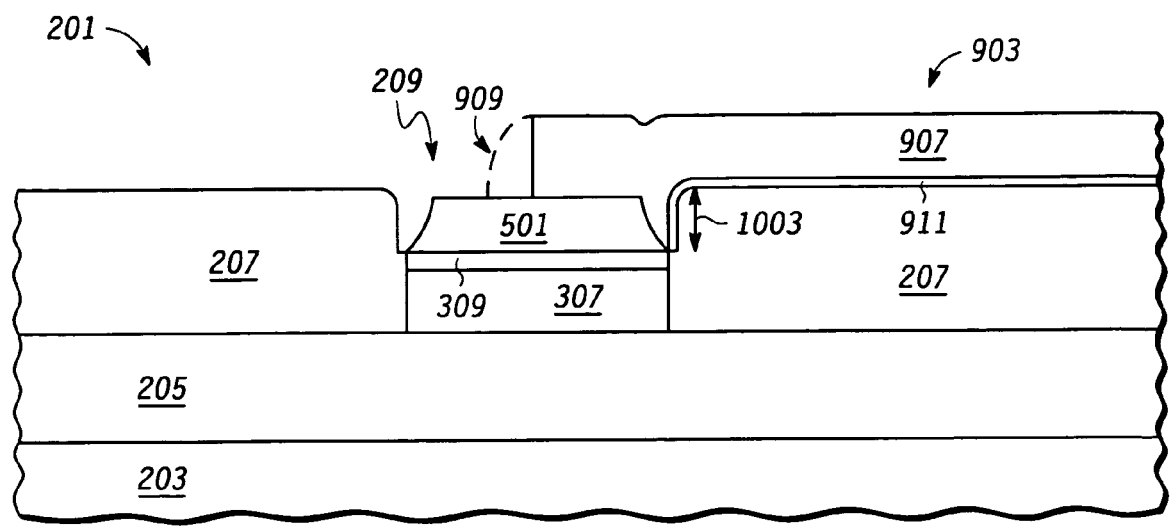
FIG. 10 is a partial cross sectional side view of a wafer during another stage of manufacture according to the present invention.

FIG. 10 shows a partial cross sectional side view of wafer 201 that is rotated by 90 degrees from the view of FIG. 9. For the view of FIG. 10, spacer 909 is not shown except for its extension into trench 209 shown in dashed lines. In the embodiment shown, gate 907 and gate oxide 911 extend into trench 209. With this embodiment, a portion of the side wall of the trench serves as a portion of the channel region of transistor 903 the which extends the effective width of the transistor (e.g. by the amount shown by arrow 1003). Because of portion 309, the depth at which the trench fill material (the material of layer 501) is removed may be controlled. Accordingly, the distance that gate 907 extends into the trench, and consequently, the effective width of the transistor maybe be controlled independent of etching and cleaning processes which are performed prior to gate deposition. Accordingly, the operability of a circuit utilizing transistor 903 may be predicted and may more closely meet design specifications. Also, in some embodiments, devices built with trenches described herein may have better voltage mismatch properties and may have less transistor variations due to mechanical stress. Such characteristics, in some embodiments, may provide for lower minimum operational voltage in memory and logic circuits. In some embodiments, all of layer 501 may be removed from trench 209 prior to when the gate material is deposited on wafer 201.

In some embodiments, the material of layers 301, 303, and 501, the thickness of those layers, and the processes for forming those layers, may be adjusted to control the strain of the channel regions of the transistors (e.g. 903 and 905) located in active regions adjacent to the trench. For example, if layer 303 is deposited by a plasma enhanced CVD process, then layer 303 has a slight compressive strain. If layer 303 is deposited by a low pressure, low temperature CVD process, then layer 303 is more tensile than if layer 303 is deposited by a plasma enhanced CVD process. Accordingly, an active region adjacent to the trench would have a more compressive strain where layer 303 is deposited by a low pressure, low temperature CVD process than if layer 303 is deposited with a plasma enhanced CVD process.

The strain of the channel region of a transistor may be adjusted to control performance of a transistor. For example, a more compressive strain of the channel region (in the transistor length direction) acts to improve hole mobility in P-channel transistors, while a greater tensile strain in the channel region (in the transistor length direction) acts to improve electron mobility. A more tensile strain in the width direction of a transistor acts to improve hole mobility of a P-channel transistor. Furthermore, stress may also be controlled based wafer rotation.

In one embodiment, a method of forming a semiconductor structure comprises providing a wafer with a semiconductor material and forming a trench into the semiconductor material. The trench includes a sidewall of the semiconductor material. The method also includes depositing a first dielectric material overlying a bottom portion of the trench to a first depth, with no substantial deposition of the first dielectric material on the sidewall in a region above the first depth. The method further includes depositing a second dielectric material overlying the first material in the trench to a second depth, with no substantial deposition of the second dielectric material on the sidewall in a region above the second depth. The second dielectric material is different from the first dielectric material. The method still further includes depositing a dielectric trench fill material over the second dielectric material in the trench. The dielectric trench fill material is selectively etchable with respect to the second dielectric material.

In another embodiment, a method of forming an isolation trench in a semiconductor structure includes providing a wafer with a semiconductor material and forming a trench into the semiconductor material. The trench includes a sidewall of the semiconductor material. The method still further includes depositing a first dielectric material overlying a bottom portion of the trench to a first depth, with no substantial deposition of the first dielectric material on the sidewall in a region above the first depth. The method still further includes depositing a second dielectric material overlying the first material in the trench to a second depth, with no substantial deposition of the second dielectric material on the sidewall in a region above the second depth. The second dielectric material is different from the first dielectric material. The first dielectric material has a first thickness and the second dielectric material has a second thickness less than the first thickness. The method also includes forming a trench sidewall liner on a portion of the semiconductor material within the trench. The second dielectric material prevents formation of the trench sidewall liner below a level of the second dielectric material within the trench. The method still further includes depositing a dielectric trench fill material over the second dielectric material in the trench. The dielectric trench fill material is selectively etchable with respect to the second dielectric material.

In another embodiment, a semiconductor structure includes a semiconductor material and a trench formed into the semiconductor material. The semiconductor structure also includes a dielectric material overlying a bottom portion of the trench to a first depth and a second dielectric material overlying the first material in the trench to a second depth. All of the first dielectric material in the trench is covered by the second dielectric material. The second depth being below a top level of the semiconductor material. The second dielectric material is different from the first dielectric material. The first material has a first dielectric constant and the second material has a second dielectric constant greater than the first dielectric constant.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:
1. A method of forming an isolation trench in a semiconductor structure comprising:
providing a wafer with a semiconductor material;
forming a trench into the semiconductor material, wherein the trench includes a sidewall of the semiconductor material;
depositing a first dielectric material overlying a bottom portion of the trench to a first depth, with no substantial deposition of the first dielectric material on the sidewall in a region above the first depth;
depositing a second dielectric material overlying the first dielectric material in the trench to a second depth, with no substantial deposition of the second dielectric material on the sidewall in a region above the second depth, wherein the second dielectric material is different from the first dielectric material, wherein the first dielectric material has a first thickness and the second dielectric material has a second thickness less than the first thickness;
forming a trench sidewall liner on a portion of the semiconductor material within the trench, wherein the second dielectric material prevents formation of the trench sidewall liner below a level of the second dielectric material within the trench; and depositing a dielectric trench fill material over the second dielectric material in the trench, wherein the dielectric trench fill material is selectively etchable with respect to the second dielectric material.

2. The method of claim 1, wherein the wafer has a semiconductor on insulator (SOI) configuration.

3. The method of claim 2, wherein:
the semiconductor material overlies an insulator;
the trench extends through the semiconductor material down to the insulator.

4. The method of claim 1, wherein the first dielectric material includes an oxide.

5. The method of claim 1, wherein the first dielectric material is characterized as a low K dielectric material.

6. The method of claim 1, wherein the depositing the first dielectric material includes depositing by a plasma enhanced CVD process.

7. The method of claim 1, wherein the depositing the first dielectric material includes depositing by a directional deposition process.

8. The method of claim 1, wherein the depositing the first dielectric material includes depositing by one of the following processes of a group consisting of an unbiased, high density, plasma enhanced chemical vapor deposition (CVD) process, a sputtering process, a plasma vapor deposition (PVD) process, a collimated PVD process, a thermal CVD process, and a high density plasma (HDP) process.

9. The method of claim 1, wherein the second dielectric material includes a nitride.

10. The method of claim 1, wherein the second dielectric material includes at least one of a group consisting of a plasma enhanced CVD nitride, a low pressure CVD nitride, bisteitiarybutylaminosilane (BTBAS), silicon rich nitride, silicon carbide (SiC), and silicon carbon nitride (SiCN).

11. The method of claim 1, wherein the depositing the dielectric trench fill material includes depositing by a biased high density plasma process.

12. The method of claim 1, wherein the second dielectric material includes a nitride and the dielectric trench fill material includes an oxide.

13. The method of claim 1, further comprising:
forming a transistor having a channel region in the semiconductor material.

14. The method of claim 1, wherein forming the trench sidewall liner includes forming an oxide liner.

15. The method of claim 1, wherein prior to forming the trench, the method further comprising:
forming a protective layer overlying the semiconductor material, wherein the forming the trench further includes forming the trench in the protective layer and the semiconductor material, wherein the trench further includes a sidewall of the protective layer and the semiconductor material.

16. The method of claim 15, wherein the protective layer includes an oxide.

17. The method of claim 15, further comprising:
forming a recess in a portion of the protective layer at the sidewall, wherein the forming the recess exposes a top edge portion of the semiconductor material at the sidewall,
wherein the forming of the trench sidewall liner includes consuming the top edge portion of the semiconductor material exposed by the recess.

18. The method of claim 15, wherein subsequent to forming the protective layer, the method further comprising:
forming an anti-reflective coating layer overlying the protective layer, wherein the forming the trench further includes forming the trench in the anti-reflective coating layer, the protective layer, and the semiconductor material, wherein the trench further includes a sidewall of the anti-reflective coating layer, the protective layer, and the semiconductor material.

19. The method of claim 18, wherein subsequent to depositing the dielectric trench fill material, the method further comprising:
planarizing the structure using the anti-reflective coating layer as a stop layer.

20. The method of claim 19, wherein planarizing includes using a chemical mechanical polishing process with the anti-reflective coating layer acting as a polishing stop.

21. The method of claim 19, wherein planarizing includes using an etch back technique with the anti-reflective coating layer acting as an etch stop.

22. The method of claim 1, wherein the first thickness and the second thickness are chosen to obtain a desired trench fill removal depth for controlling a distance that a gate material extends into the trench.

23. The method of claim 1, wherein prior to forming the trench, the method further comprising:
forming a protective layer overlying the semiconductor material, wherein the forming the trench further includes forming the trench in the protective layer and the semiconductor material, wherein the trench further includes a sidewall of the protective layer and the semiconductor material and wherein prior to the forming the trench sidewall liner, the method further comprising:
forming a recess in a portion of the protective layer on the sidewall, wherein forming the recess exposes a top edge portion of the semiconductor material at the sidewall, further wherein the forming of the trench sidewall liner consumes the top edge portion of the semiconductor material exposed by the recess.

24. The method of claim 23, wherein subsequent to forming the protective layer, the method further comprising:
forming an anti-reflective coating layer overlying the protective layer, wherein forming the trench further includes forming the trench in the anti-reflective coating layer, the protective layer, and the semiconductor material, wherein the trench further includes a sidewall of the anti-reflective coating layer, the protective layer, and the semiconductor material.

* * * * *

UNITED STATES PATENT AND TRADEMARK OFFICE
CERTIFICATE OF CORRECTION

PATENT NO. : 6,979,627 B2  Page 1 of 1
APPLICATION NO. : 10/836150
DATED : April 30, 2004
INVENTOR(S) : Choh-Fei Yeap It is certified that error appears in the above-identified patent and that said Letters Patent is hereby corrected as shown below:

In Column 7, Line 33, Claim 10,

Change "bisteitiarybutylaminosilane" to --bistertiarybutylaminosilane--

Signed and Sealed this

Twenty-second Day of July, 2008

JON W. DUDAS
*Director of the United States Patent and Trademark Office*

UNITED STATES PATENT AND TRADEMARK OFFICE
CERTIFICATE OF CORRECTION

PATENT NO.         : 6,979,627 B2                                    Page 1 of 1
APPLICATION NO. : 10/836150
DATED               : December 27, 2005
INVENTOR(S)       : Choh-Fei Yeap It is certified that error appears in the above-identified patent and that said Letters Patent is hereby corrected as shown below:

In Column 7, Line 33, Claim 10,

Change "bisteitiarybutylaminosilane" to --bistertiarybutylaminosilane--

This certificate supersedes the Certificate of Correction issued July 22, 2008.

Signed and Sealed this

Twelfth Day of August, 2008

JON W. DUDAS
*Director of the United States Patent and Trademark Office*